United States Patent
Lee et al.

(10) Patent No.: US 12,454,636 B2
(45) Date of Patent: Oct. 28, 2025

(54) ADHESIVE FILM FOR POLISHING PAD, LAMINATED POLISHING PAD INCLUDING THE SAME AND METHOD OF POLISHING WAFER

(71) Applicant: Enpulse Co., Ltd., Cheonan-si (KR)

(72) Inventors: Jung Nam Lee, Seoul (KR); Sunghoon Yun, Seoul (KR); Jangwon Seo, Seoul (KR)

(73) Assignee: Enpulse Co., Ltd., Cheonan-si (KR)

( * ) Notice: Subject to any disclaimer, the term of this patent is extended or adjusted under 35 U.S.C. 154(b) by 713 days.

(21) Appl. No.: 17/751,942

(22) Filed: May 24, 2022

(65) Prior Publication Data
US 2022/0380644 A1    Dec. 1, 2022

(30) Foreign Application Priority Data
May 26, 2021 (KR) .......................... 10-2021-0067602

(51) Int. Cl.
| | | |
|---|---|---|
| *C09J 167/03* | (2006.01) | |
| *B24B 37/24* | (2012.01) | |
| *C09J 5/06* | (2006.01) | |
| *C09J 7/35* | (2018.01) | |
| *H01L 21/02* | (2006.01) | |

(52) U.S. Cl.
CPC ............. *C09J 167/03* (2013.01); *B24B 37/24* (2013.01); *C09J 5/06* (2013.01); *C09J 7/35* (2018.01); *H01L 21/02013* (2013.01); *Y10T 428/218* (2015.01); *Y10T 428/24273* (2015.01)

(58) Field of Classification Search
CPC ..... C09J 167/03; C09J 5/06; C09J 7/35; C09J 2301/18; C09J 2301/312; B24B 37/24; B24B 37/34; B24B 37/07; B24B 37/20; B24B 37/10; H01L 21/02013; Y10T 428/218; Y10T 428/24273; B24D 18/0045
See application file for complete search history.

(56) References Cited

U.S. PATENT DOCUMENTS

| | | | |
|---|---|---|---|
| 2007/0166510 A1* | 7/2007 | Kato | ........................... C09J 7/20 428/137 |
| 2008/0193695 A1* | 8/2008 | Kato | ........................... C09J 7/38 428/41.8 |
| 2009/0047884 A1* | 2/2009 | Swisher | .................. B24B 37/26 451/533 |

FOREIGN PATENT DOCUMENTS

| | | |
|---|---|---|
| JP | 1999-151661 A | 6/1999 |
| JP | 2016-74052 A | 5/2016 |
| KR | 10-2011-0076163 A | 7/2011 |
| KR | 10-2013-0108476 A | 10/2013 |
| KR | 10-2015-0026903 A | 3/2015 |
| TW | 202019618 A | 6/2020 |

* cited by examiner

*Primary Examiner* — Donald M Flores, Jr.
(74) *Attorney, Agent, or Firm* — NSIP Law

(57) ABSTRACT

An adhesive film for a polishing pad including a plurality of through holes extended from a top surface to a bottom surface of the adhesive film, wherein a volume fraction of the plurality of through holes is 3% to 20% based on a total volume of the adhesive film, is disclosed.

14 Claims, 5 Drawing Sheets

ADHESIVE FILM FOR POLISHING PAD, LAMINATED POLISHING PAD INCLUDING THE SAME AND METHOD OF POLISHING WAFER

CROSS-REFERENCE TO RELATED APPLICATIONS

This application claims the benefit under 35 USC 119(a) of Korean Patent Application No. 10-2021-0067602 filed on May 26, 2021 in the Korean Intellectual Property Office, the entire disclosures of which are incorporated herein by reference for all purposes.

BACKGROUND

1. Field

An adhesive film for a polishing pad, a laminated polishing pad including the same, and a method of polishing a wafer are disclosed.

2. Description of Related Art

A wrapping process or a polishing process within manufacturing processes for a wafer is considered as an important factor affecting greatly to the yield rate of a wafer and causing planarization, scratches, defects, and the like of the wafer. The polishing process achieves polishing through friction of a polishing pad and a wafer under pressurization of a plate while using slurry as a polishing agent, and a polishing apparatus includes a polishing head, in which the plate and the wafer are fixed for independent rotation thereof.

The polishing pad, which is used in such a polishing process, smoothens a surface of the wafer surface and removes unnecessary portions of the wafer through even polishing work of chemical mechanical planarization CMP process.

The surface of the polishing pad consists of grooves and hollows for generating a flow of slurry. To embody even polishing performance, it is necessary to consider methods of minimizing occurrence of hollows in a process of attaching a polishing pad to a plate, improving characteristics of the wafer surface during the polishing of the wafer, and simplifying the attaching method.

SUMMARY

In one general aspect, an adhesive film for a polishing pad according to embodiments may include, a plurality of through holes extended from a top surface to a bottom surface of the adhesive film, wherein a volume fraction of the plurality of through holes may be 3% to 20% based on a total volume of the adhesive film.

In one embodiment, the adhesive film may have a compressive ratio of 0.98% or more calculated by Equation 1 below, when compressed in a thickness direction of the adhesive film under a pressure of 6.89 kPa to 48.26 kPa:

$$\text{compressive ratio} = (\text{thickness loss of the adhesive film after the compression/original thickness of the adhesive film}) \times 100\%, \quad [\text{Equation 1}]$$

In one embodiment, the plurality of through holes may include a first through hole and a second through hole adjacent to each other, and an interval between the first through hole and the second through hole may be 2 mm to 20 mm.

In one embodiment, each of the plurality of through holes may have an average cross-sectional area of 100 $mm^2$ or less, where the average cross-sectional area may be obtained by dividing a total cross-sectional area of the plurality of through holes, which is measured on a plane perpendicular to a thickness direction of the adhesive film, by a total number of the plurality of through holes.

In one embodiment, a cross-sectional shape of each of the plurality of through holes, which may be obtained on a plane perpendicular to a thickness direction of the adhesive film, may be substantially same.

In one embodiment, the cross-sectional shape may be enclosed by a single closed curve.

In one embodiment, the cross-sectional shape may be selected from the group consisting of a circle, a square, a triangle, an oval, and a polygon including three to eight sides.

In one embodiment, a total number of the plurality of through holes may be 3 to 300.

In one embodiment, the volume fraction of the plurality of through holes may be 4% to 18% based on the total volume of the adhesive film.

In one embodiment, a release force according to ASTM D3330 of the adhesive film may be 1.0 kgf/in to 3.0 kgf/in.

In one embodiment, a thickness of the adhesive film may be 20 μm to 300 μm.

In one embodiment, the compressive ratio may be increased by 0.5% to 2.66% compared to an adhesive film for a polishing pad not including the plurality of through holes.

In one embodiment, an aperture ratio of the plurality of through holes calculated by Equation 2 below may be 3% to 20:

$$\text{aperture ratio} = (\text{cross-sectional area of the plurality of through holes/cross-sectional area of the adhesive film}) \times 100\%, \quad [\text{Equation 2}]$$

where the cross-sectional area of the plurality of through holes and the cross-sectional area of the adhesive film are measured on a plane perpendicular to a thickness direction of the adhesive film.

In one general aspect, a laminated polishing pad according to embodiments may include, a polishing pad; and an adhesive film for the polishing pad attached to one surface of the polishing pad, wherein the polishing pad includes a plurality of through holes extended from a top surface to a bottom surface of the adhesive film, and wherein a volume fraction of the plurality of through holes may be 3% to 20% based on a total volume of the adhesive film In one embodiment, the adhesive film may have a compressive ratio of 0.98% or more calculated by Equation 1 below, when compressed in a thickness direction of the adhesive film under a pressure of 6.89 kPa to 48.26 kPa:

$$\text{compressive ratio} = (\text{thickness loss of the adhesive film after the compression/original thickness of the adhesive film}) \times 100\%. \quad [\text{Equation 1}]$$

In one embodiment, an aperture ratio of the plurality of through holes calculated by Equation 2 below may be 3% to 20:

$$\text{aperture ratio} = (\text{cross-sectional area of the plurality of through holes/cross-sectional area of the adhesive film}) \times 100\%, \quad [\text{Equation 2}]$$

where the cross-sectional area of the plurality of through holes and the cross-sectional area of the adhesive film are measured on a plane perpendicular to a thickness direction of the adhesive film.

In one embodiment, the laminated polishing pad may have a standard deviation of a polishing rate, which is a removal rate of Å/minute and calculated by Equation 3 below, of 40 or less calculated by Equation 3 below, within an inner area except for an edge area occupying equal or less than 10% of a diameter of a wafer in a direction from an edge to a center of the wafer:

polishing rate=polishing thickness of wafer per minute (Å/minute). [Equation 3]

In one general aspect, a method of polishing a wafer according to embodiments may include, preparing a laminated polishing pad attached to a plate and a polishing head, to which a wafer has been fixed; and rotating any one or both of the plate and the polishing head, while contacting the wafer with the laminated polishing pad with adding slurry, wherein the laminated polishing pad may include: a polishing pad; and an adhesive film for the polishing pad attached to one surface of the polishing pad, wherein the polishing pad may include a plurality of through holes extended from a top surface to a bottom surface of the adhesive film, and wherein a volume fraction of the plurality of through holes is 3% to 20% based on a total volume of the adhesive film.

In one embodiment, the adhesive film may have a compressive ratio of 0.98% or more calculated by Equation 1 below, when compressed in a thickness direction of the adhesive film under a pressure of 6.89 kPa to 48.26 kPa:

compressive ratio=(thickness loss of the adhesive film after the compression/original thickness of the adhesive film)×100%. [Equation 1]

In one embodiment, an aperture ratio of the plurality of through holes calculated by Equation 2 below may be 3% to 20%:

aperture ratio=(cross-sectional area of the plurality of through holes/cross-sectional area of the adhesive film)×100%, [Equation 2]

where the cross-sectional area of the plurality of through holes and the cross-sectional area of the adhesive film are measured on a plane perpendicular to a thickness direction of the adhesive film.

Other features and aspects will be apparent from the following detailed description, the drawings, and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
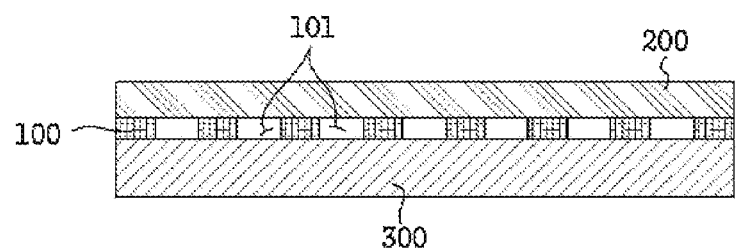
FIG. 1 is a sectional view showing one example of the adhesive film 100 intervened between a plate 300 and a polishing pad 200 according to one embodiment.

Hereinafter, example embodiments of the present disclosure will be described in detail with reference to the accompanying drawings so that they can be easily practiced by those skilled in the art to which the present invention pertains. However, the example embodiments may be embodied in many different forms and is not to be construed as being limited to the embodiments set forth herein. Like reference numerals designate like elements throughout the specification.

In this disclosure, the phrase that a certain element "comprises" or "includes" another element means that the certain element may further include one or more other elements but does not preclude the presence or addition of one or more other elements, unless stated to the contrary.

In this disclosure, when an element is referred to as being "connected" to another element, it can be understood not only as a case of a certain element directly connected to the other element but also as a case of having other elements interposed therebetween.

In this disclosure, "B being placed on A" means that B is placed in direct contact with A or placed over A with another layer or structure interposed therebetween and thus should not be interpreted as being limited to B being placed in direct contact with A.

Throughout this disclosure, the phrase "combination(s) thereof" included in a Markush-type expression denotes one or more mixtures or combinations selected from the group consisting of components stated in the Markush-type expression, that is, denotes one or more components selected from the group consisting of the components are included.

Throughout this disclosure, the description of "A and/or B" means "A, B, or A and B."

Throughout this disclosure, terms such as "first", "second", "A", or "B" are used to distinguish the same terms from each other unless specially stated otherwise.

In this disclosure, a singular form is contextually interpreted as including a plural form as well as a singular form unless specially stated otherwise.

An objective of the present disclosure is to allow easy adhesion of a polishing pad and a plate through an adhesive film having a specific through hole and to minimize occurrence of unnecessary hollows.

Another objective of the present disclosure is to provide an adhesive film for a polishing pad, which allows a wafer to have more uniform surface characteristics when the wafer is polished.

Another objective of the present disclosure is to provide an adhesive film for a polishing pad, whose detaching is easily performed when being replaced after a polishing pad is used.

The adhesive film for a polishing pad according to one embodiment can minimize the occurrence of unnecessary hollows when a plate and a polishing pad are attached, and can achieve a more uniform polishing rate, when the surface of a wafer is polished through the polishing pad including the adhesive film. Additionally, when the polishing pad is removed after the polishing process is performed, it is easy to remove residues such that the residues do not remain substantially on an adhesive layer of a plate or the like.

The inventors have invented the adhesive film including through holes and having a certain compressive ratio considering simplification of a method attaching a polishing pad to a plate. The inventors have also invented a method of minimizing the occurrence of hollows in the process of attaching the polishing pad to the plate to achieve uniform polishing performance in a polishing process of a wafer.

Adhesive Film for Polishing Pad

In one general aspect, an adhesive film for a polishing pad 100 according to one embodiment includes, a plurality of through holes, wherein the volume fraction of the plurality of through holes may be 3% to 20% based on a total volume of the adhesive film.

The adhesive film may have a compressive ratio of 0.98% or more calculated by Equation 1 below, when compressed in a thickness direction of the adhesive film under pressure of 6.89 kPa to 48.26 kPa:

compressive ratio=(thickness loss of the adhesive film after the compression/original thickness of the adhesive film)×100%. [Equation 1]

The through holes 101 refer to holes passing through the top and bottom of the adhesive film, and may be formed through general punching means.

The average cross-sectional area of the through holes 101 may be 100 mm² or less, or 75 mm² or less. The average cross-sectional area may be obtained by dividing a total cross-sectional area of the plurality of through holes by a total number of the plurality of through holes, and the cross-sectional area may be obtained based on a plane perpendicular to the thickness direction of the adhesive film, i.e., the height direction of the through holes. The average cross-sectional area may be 4 mm² or more, or 6 mm² or more. When the average area of the through holes is more than 100 mm², or less than 4 mm², there is a problem of a surface, which is not evenly polished when a wafer is polished through a polishing pad including the same.

All the through holes 101 may have substantially the same area, or the areas may be distinguished from one another depending on the relative position thereof.

The through holes 101 may have a regular shape on the plane perpendicular to the thickness direction of the adhesive film.

Each of the through holes 101 may have a cross-sectional shape enclosed by a single closed curve on the plane perpendicular to the thickness direction of the adhesive film. For example, the cross-sectional shape may be a circle or a figure having a line and a curve, or may be a circle (2A), a square (2B), a triangle (2C), an oval, or a polygon having three to eight sides as illustrated in FIGS. 2A to 2C.

Figure 2A:
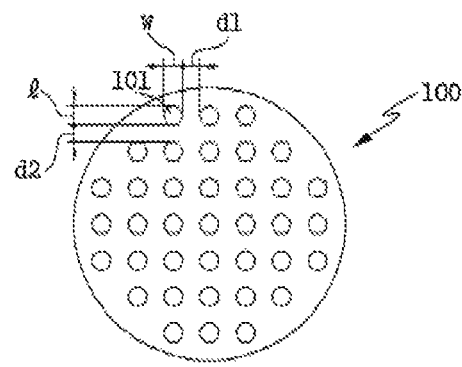
FIG. 2A to 2C are plan views showing examples of the adhesive film 100 according to one embodiment.
Figure 2B:
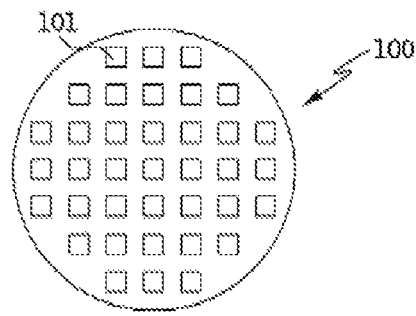
Figure 2C:
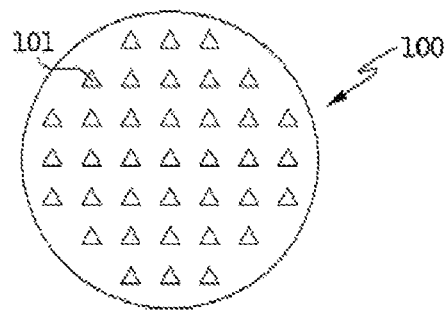

Referring to FIG. 2A, the section perpendicular to the height direction of the through holes 101 may have a horizontal length (w) of 1 mm to 20 mm, and a vertical length (I) of 1 mm to 20 mm.

The through holes 101 may include a first through hole and a second through hole adjacent to each other, and an interval between the first through hole and the second through hole is 2 mm to 20 mm.

The arrangement of the through holes may be regular or irregular. When the through holes are arranged in a regular pattern having fixed intervals of the width (d1) and length (d2), the intervals (d1 and d2) between through holes may be 2 mm to 20 mm, or 3 mm to 15 mm. The adhesive film having the above interval range can minimize the occurrence of unnecessary hollows, and the removal thereof with a plate can also be easily made in a replacing process of a polishing pad. When the through holes are arranged in an irregular pattern, the interval between one through hole and another through hole adjacent to the one through hole may be 2 mm or more, or 20 mm or less.

The interval may be an interval on a ground plane as viewed in the position facing the thickness direction of the adhesive film for the polishing pad 100.

The number of the through holes 101 may be 3 to 300, 9 to 280, or 16 to 250 based on one surface of the adhesive film. The through holes have a proper number range, and thereby can stably secure optimal through hole.

The volume fraction of the plurality of through holes 101 based on the total volume of the adhesive film may be 3% to 20%, 4% to 18%, or 6% to 15%. The volume fraction may be a ratio of the sum of the volumes occupied by the plurality of through holes, based on the total volumes of the adhesive film for the polishing pad before the formation of the plurality of through holes. By applying the adhesive film having the volume fraction described above to a polishing pad and a plate, uniform wafer surface characteristics can be obtained when a wafer is polished. When the volume fraction is more than the above range, attachment to the plate or the polishing pad may not be effectively achieved, and when the volume fraction is less than the above range, uniform surface characteristics of the wafer may not be achieved.

The adhesive film for a polishing pad 100 may have an aperture ratio of 3% to 20%, 4% to 18%, or 6% to 15%. The aperture ratio may be calculated by Equation 2 below:

aperture ratio=(cross-sectional area of the plurality of through holes/cross-sectional area of the adhesive film)×100%, [Equation 2]

where the cross-sectional area of the plurality of through holes and the cross-sectional area of the adhesive film are measured on a plane perpendicular to a thickness direction of the adhesive film.

The through holes 101 may be formed by dividing one surface of the adhesive film for a polishing pad 100 into a plurality of pattern areas neighboring from one another; arranging a reference point at the center of the pattern area; and setting the figures of through holes with the reference point as the center. The dividing operation may allow the areas to have the maximum number of patterns on one surface of the adhesive film for the polishing pad, and the average area of each pattern may be 4 mm² to 100 mm², and the figure may be a single closed curve, a polygon, and the like. The setting operation may set the figure such as a circle, a triangle, a square, a polygon, and the like with the reference point as the center. The adhesive film for the polishing pad 100 was measured for the release force (adhesive force) according to ASTM D3330, and the release force according to the above may be 1.0 kgf/in to 3.0 kgf/in, or 1.3 kgf/in to 1.7 kgf/in. The adhesive film satisfying the release force may prevent delamination of a waver in a polishing process when interposed between a polishing pad and a plate, may achieve stable adhesive force, and may facilitate the removal of the film when the polishing pad is replaced.

The removal of the adhesive film for a polishing pad 100 from a polishing pad or a plate attached thereto is physically performed.

The adhesive film may have a compressive ratio of 0.98% or more calculated by Equation 1 below, when compressed in a thickness direction of the adhesive film under a pressure of 6.89 kPa to 48.26 kPa:

compressive ratio=(thickness loss of the adhesive film after the compression/original thickness of the adhesive film)×100%. [Equation 1]

Specifically, the compressive ratio of the adhesive film for a polishing pad 100 may be 0.98% or more, 1.08% or more, or 1.27% or more, under the condition of compressing the adhesive film interposed between a polishing pad and a plate in a thickness direction of the adhesive film under a pressure of 6.89 kPa to 48.26 kPa. The compressive ratio may be 3.3% or less, 2.97% or less, or 2.48% or less. The compressive ratio is a thickness variation rate of the adhesive film, and the adhesive film satisfying the above range can stably secure hollows through the through hole, and can minimize the deviation of polishing rate upon application to a polishing pad and a plate when a wafer is polished. The compressive ratio may be measured through a compressive ratio meter available from YASUDA as described in experiment examples, or may be measured under the condition corresponding to the pressure (27.6 kPa) when the wafer described in the present disclosure is contacted to a plate.

The adhesive film for the polishing pad 100 may have a compressive ratio increased by 0.5% to 2.66%, or by 0.55% to 2.39% compared to the same adhesive film for a polishing pad not including the plurality of through holes.

The thickness of the adhesive film for the polishing pad 100 may be 20 μm to 300 μm, or 25 μm to 225 μm. The adhesive film having above the thickness range can show a good adhesive force when interposed between a polishing pad 200 and a plate 30 and a proper degree of delamination when the polishing pad is replaced, and thus a waste of raw material necessary to manufacture the film can be minimized.

The overall appearance of the adhesive film for the polishing pad 100 may correspond to the appearance of the polishing pad 200 and the plate 300, and may be the shape of a circle, a donut, or the like.

Manufacturing Method of Adhesive Film of Polishing Pad

In one general aspect, a manufacturing method of an adhesive film for a polishing pad according to one embodiment may include: applying and curing a hot-melt bond including a thermoplastic resin on an arbitrary substrate to form an adhesive film; and forming a plurality of through holes on the adhesive film to have a predetermined pattern.

For example, the thermoplastic resin may be any one or more selected from the group consisting of a polyurethane-based resin, a polyethylene terephthalate resin, a polyester-based resin, an ethylene-vinyl acetate-based resin, a polyamide-based resin, and a polyolefin-based resin.

The thickness of the applied bond in the applying operation may be 20 μm to 350 μm, or 25 μm to 250 μm.

The through holes 101 may be formed by dividing one surface of the adhesive film for a polishing pad 100 into a plurality of pattern areas neighboring from one another; arranging a reference point at the center of the pattern area; and setting the figures of through holes with the reference point as the center. The dividing operation may allow the areas to have the maximum number of patterns on one surface of the adhesive film for the polishing pad, and the average area of each pattern may be 4 mm² to 100 mm², and the figure may be a single closed curve, a polygon, and the like.

The characteristics of the plurality of through holes 101 formed during punching after the pattern formation may be as follows. Each of the plurality of through holes 101 may have an average area of 100 mm² or less, or 75 mm² or less. The average area is obtained by dividing the sum of areas of the through holes by the number of through holes, and may be based on the section perpendicular to the height direction of through holes. The average area may be 4 mm² or more, or 6 mm² or more. The respective through holes may have substantially identical areas.

Each of the through holes 101 may have a cross-sectional shape enclosed by a single closed curve on the plane perpendicular to the thickness direction of the adhesive film. For example, the cross-sectional shape may be a circle or a figure having a line and a curve, or may be a circle (2A), a square (2B), a triangle (2C), an oval, or a polygon having three to eight sides as illustrated in FIGS. 2A to 2C. The arrangement of the through holes may be regular or irregular. The plurality of through holes may have cross-sections with regular areas based on the height direction.

The through holes 101 may include a first through hole and a second through hole adjacent to each other, and an interval between the first through hole and the second through hole is 2 mm to 20 mm. When the arrangement of the plurality of through holes is in a regular pattern with regular intervals vertically and horizontally, the interval between through holes may be 2 mm to 20 mm, or 3 mm to 15 mm. When the arrangement of the plurality of through holes is in an irregular pattern, some of the shapes of through holes set in the pattern formation process may be not punched, and the interval between one through hole and another through hole adjacent to the one through hole may be 2 mm or more, or 20 mm or less at most. The interval may be an interval on a ground plan at the position of viewing the thickness direction of the adhesive film of a polishing pad.

The number of through holes may be 3 to 300, 9 to 280, or 16 to 250 based on one surface of the adhesive film. The volume fraction of the plurality of through holes may be 3% to 20%, 4% to 18%, or 6% to 15% based on a total volume of the adhesive film. The volume fraction may be a ratio occupied by the sum of the volumes occupied by the plurality of through holes based on the total volumes of the adhesive film for the polishing pad before the formation of the plurality of through holes.

The manufacturing method of an adhesive film for a polishing pad may further include an operation of separating the adhesive film from the arbitrary substrate after the punching operation.

Laminated Polishing Pad

In one general aspect, a laminated polishing pad according to one embodiment includes, a polishing pad 200; and an adhesive film for a polishing pad 100 attached to one surface of the polishing pad.

The polishing pad 200 of the laminated polishing pad may include one surface for polishing a wafer and the other surface, which is the opposite surface, and the adhesive film for a polishing pad 100 may be attached to the other surface.

The polishing pad 200 may include a polyurethan resin and hollows formed in the polyurethan resin.

The polishing pad 200 may be one made from a composition including a urethane-based prepolymer, a curing agent, a reaction speed regulator, and a foaming agent. The prepolymer refers to a polymer having a relatively low molecular weight, whose polymerization may be stopped in an intermediate stage for easy shaping of a kind of final product. The prepolymer may be shaped by itself or may be shaped after reacted with another polymerizing compound. For example, the urethan-based prepolymer may be manufactured by reacting an isocyanate-based compound and polyol, and may include an unreacted isocyanate group.

The isocyanate-based compound may be for example, any one or more selected from the group consisting of toluene diisocyanate, naphthalene-1,5-diisocyanate, p-phenylene diisocyanate, tolidine diisocyanate, 4,4'-diphenyl methane diisocyanate, hexamethylene diisocyanate, dicyclohexylmethane diisocyanate, and isoporone diisocyanate.

The polyol may be for example, one or more types of polyols selected from the group consisting of polyether polyol, polyester polyol, polycarbonate polyol, and acryl polyol. The polyol may have a weight average molecular weight (Mw) of 300 g/mol to 3,000 g/mol.

The curing agent may be any one or more selected within amine compounds and alcohol compounds. For example, the curing agent may be any one or more selected from the group consisting of MOCA, diethyltoluenediamine, diaminodiphenyl methane, diaminodiphenyl sulphone, m-xylylene diamine, isophoronediamine, ethylenediamine, diethylenetriamine, triethylenetetramine, polypropylenediamine, polypropylenetriamine, ethyleneglycol, diethyleneglycol, dipropyleneglycol, butanediol, hexanediol, glycerine, trimethylolpropane, and bis(4-amino-3-chlorophenyl) methane.

The reaction speed regulator may be a reaction accelerator or a reaction retarder.

The reaction accelerator may be any one or more selected from the group consisting of benzyldimethylamine, N,N-dimethyl cyclohexyl amine (DMCHA), and triethyl amine (TEA).

The reaction retarder may be an acid compound, benzoyl chloride, or the like.

The foaming agent may be any one or more selected from the group consisting of a solid foaming agent having a gap, a liquid foaming agent, in which a volatile liquid is filled, and an inert gas.

The solid foaming agent may be a thermally-expanded microcapsule, and the thermally-expanded microcapsule may be obtained by heating and expanding a microcapsule. The microcapsule may include a skin including a thermoplastic resin; and a foaming agent embedded with being sealed in the skin. The thermoplastic resin may be any one or more selected from within vylidene chloride-based copolymers, acrylonitrile-based copolymers, methacrylonitrile-based copolymers, and acrylic copolymers. The foaming agent embedded with being sealed may be one including hydrocarbon with one to seven carbons.

The polishing pad 200 may have a thickness of 1 mm to 5 mm, or 1.5 mm to 3 mm. In the above range, the polishing pad can show good properties.

The polishing pad 200 may have grooves for mechanical polishing on the surface thereof. The grooves may have proper depth, width, and intervals for mechanical polishing.

The polishing pad 200 may have a Shore hardness of 30 Sh D to 80 Sh D, or 40 Sh D to 70 Sh D.

The density of the polishing pad 200 may be 0.6 g/cm³ to 0.9 g/cm³.

The polishing pad 200 may have an arithmetic mean roughness (Ra) of 1 μm to 30 μm, or 1 μm to 20 μm in the other surface, where the adhesive film for a polishing pad 100 is bonded. The polishing pad having the above roughness can exhibit an excellent adhesive force with an adhesive film for a polishing pad, and can minimize the occurrence of unnecessary hollows.

The polishing pad 200 may include multiple hollows, and the average size of the hollows may be 10 μm to 100 μm. Also, the polishing pad may include an open type hollow exposed on the surface thereof, and the average size of the open type hollows may be 3 μm to 80 μm. The size of the open type hollows may mean the maximum length of a figure having the same area with the surface shape (perimeter) of the opening of the open type hollows.

The adhesive film for a polishing pad 100 attached to the laminated polishing pad may be same as described above.

The laminated polishing pad may have a standard deviation of a polishing rate, which is a removal rate of Å/minute and calculated by Equation 3 below, of 40 or less, 35 or less, 30 or less, or 25 or less, within an inner area except for an edge area occupying equal or less than 10% of a diameter of a wafer in a direction from an edge to a center of the wafer, when the wafer is polished by using silica slurry. The standard deviation may be 10 or more.

polishing rate=polishing thickness of wafer per minute (Å/minute). [Equation 3]

In Equation 3, the polishing thickness of a wafer shows the thickness variation of the wafer before and after the polishing.

By the laminated polishing pad having the above standard deviation for the polishing rate, a uniform wafer surface can be obtained in the inner area except for the edge area occupying 10% of the diameter of the wafer in the direction from the edge to the center of the wafer.

The laminated polishing pad may have a polishing rate of 2580 or more, 2600 or more, or 2900 or less according to Equation 3 above, when a wafer is polished by using silica slurry.

Polishing Method of Wafer

In one general aspect, a polishing method of a wafer according to one embodiment includes a polishing operation of polishing using the laminated polishing pad.

Figure 3:
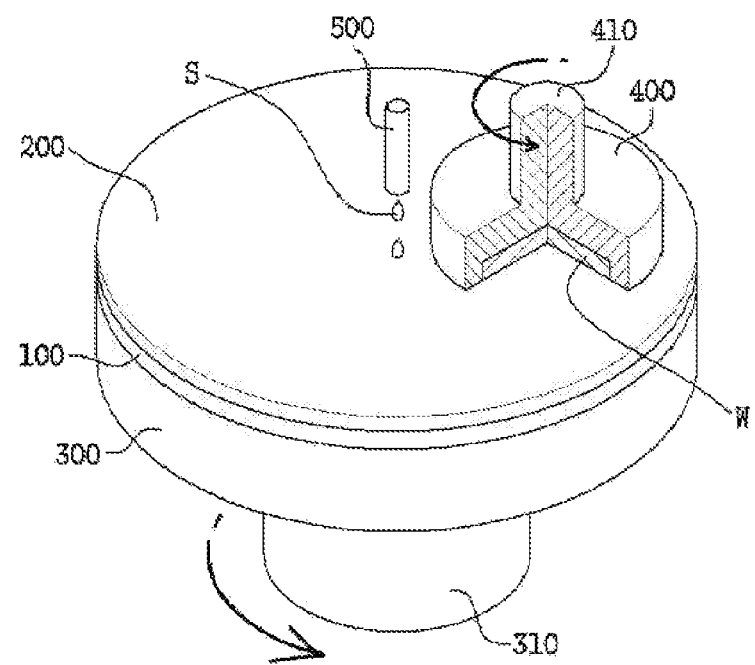
FIG. 3 is a conceptual view showing one example of a wafer polishing device, which may be applied to the polishing method of a wafer according to one embodiment.

With reference to FIG. 3, the polishing operation may be made by attaching the laminated polishing pad on a plate 300, and contacting a wafer with a polishing pad 200 of the laminated polishing pad in addition to slurry (S) supplied from an injecting nozzle 500, and at this time, a polishing head 400, to which a wafer (W) has been fixed is also rotated with the plate rotating together.

The polishing operation may further include an operation of conditioning the surface of the polishing pad before polishing as needed.

The plate 300 may be rotated by a rotating axis of the plate 310, and the polishing head 400 may be rotated by a rotating axis of the head 410.

The slurry (S) may polish a wafer contacted to a polishing pad 200 while penetrating into a wafer (W) fixed to the polishing head 400.

The slurry (S) may include polishing particles; a dispersant; a pH regulator; residual amount of deionized water, and the like.

The polishing particles may be one or more selected from fumed silica, colloidal silica, alumina, ceria, zirconia.

The polishing particles may have an average particle size ($D_{50}$) of 10 nm to 150 nm, but the size is not limited thereto.

The polishing particles may be included in an amount of 0.1 wt % to 20 wt % compared to the entire slurry (S).

The dispersant may include one or more selected from polymer dispersants, and amine-based compounds.

The pH regulator may be one or more selected from alkali metal hydroxides, carbonates, hydrochloric acid, nitric acid, sulfuric acid, phosphoric acid, formic acid and acetic acid.

The slurry may further include additives (a water-soluble polymer, an organic acid, a chelating agent, a surfactant, and the like) added to ordinary slurry compounds, along with the above materials.

The polishing operation may add a pressure of 6.89 kPa to 48.26 kPa, or a pressure of 13.79 kPa to 34.47 kPa when a wafer (W) is contacted to a plate 200 through a polishing head 400 by adding the slurry (S).

The polishing operation may proceed for 50 seconds to 10 minutes, and may be changed depending on the degree of desired polishing.

A cleaning operation of cleaning the wafer after the polishing operation may be further included.

The cleaning operation may be made through purified water and inert gas for the polished wafer.

The wafer, to which the polishing operation is performed, may have a standard deviation of 40 or less, 35 or less, 30 or less, or 25 or less for the wafer polishing rate, which is a removal rate of Å/minute and calculated by Equation 3 below, within an inner area except for an edge area occupying equal or less than 10% of a diameter of a wafer in a direction from an edge to a center of the wafer. The standard deviation may be 10 or more.

polishing rate=polishing thickness of wafer per minute (Å/minute). [Equation 3]

In Equation 3, the polishing thickness of a wafer shows the thickness variation of the wafer before and after the polishing.

By having the standard deviation of the polishing rate, a uniform wafer surface except for the edge area occupying 10% of the diameter at the most in the center direction from the edge of a wafer can be obtained.

The polishing operation may have a polishing rate of 2580 or more, 2600 or more, or 2900 or less according to the Equation 1 above.

Hereinafter, the present disclosure will be described in more detail with reference to the accompanying examples. Example embodiments below are no more than examples for helping to understand the present disclosure, and the scope of the present disclosure is not limited thereto.

1. Manufacture of Adhesive Film for Polishing Pad in which Circle, Square, and Triangle Through Holes are Formed An adhesive film with a diameter of 300 mm and a thickness of 150 μm, which was manufactured through an acryl adhesive made from a polyethylene terephthalate resin, was prepared.

Two hundred through holes having sections of a circle, a square, and a regular triangle were formed through a punching device to the manufactured film, and the diameter of the circle, the length of a side of the square, and the length of a side of the regular triangle were to be 3 mm or 7 mm, respectively. The horizontal and vertical intervals of the through holes were 3.0 mm and 7.0 mm to be uniform, respectively, and the result was shown in Table 1.

2. Manufacture of Laminated Polishing Pad

In a casting apparatus, through lines for injecting an urethane-based prepolymer, a curing agent, an inert gas, and a reaction speed regulator, PUGL-550D (SKC corporation) having unreacted NCO of 9.1 wt % was filled into a prepolymer tank, bis(4-amino-3-chlorophenyl)methane (Ishihara corporation) was filled into a curing agent tank, and nitrogen was prepared as an inert gas. Triethylenediamine (Sigma Aldrich corporation) was used as the reaction accelerator. Additionally, a solid phase foaming agent (F-65DE of 50 μm, Matsumoto Yushi Seiyaku corporation) was injected to a prepolymer tank in an amount of 1.5 parts by weight based on the urethane-based prepolymer of 100 parts by weight.

Through respective injecting lines, the urethane-based prepolymer, curing agent, reaction speed regulator, and inert gas were put in a regular speed to a mixing head and stirred. At this time, the mole amount of the NCO group of the urethane-based prepolymer and the mole amount of the reactive group of the curing agent were set to be 1:1 and the input of the sum thereof was maintained at a rate of 10 kg/min.

The stirred materials were injected to a mold with a width of 1000 mm, a length of 100 mm, and a height of 3 mm, and to be a solid phase, thereby obtaining a sheet. Subsequently, through processes of grinding the surface by using a grinder and grooving the surface by using a tip and a process of cutting the sheet to be the shape with a dimeter of 300 mm, a polyurethane polishing pad with an average thickness of 2 mm was prepared.

The prepared adhesive film for a polishing pad was pressed with heat at 120° C. on the other surface of the prepared polyurethane polishing pad, and thereby a laminated polishing pad was manufactured.

3. Evaluation of Release Force of Adhesive Film for Polishing Pad

The prepared adhesive film for a polishing pad was evaluated for the release force according to ASTM D3330, and the result was shown in Table 1.

4. Measurement of Compressive Ratio

After the manufactured adhesive film for a polishing pad was interposed between the polishing pad and the plate and compressed by one-axis, the thickness variation of the adhesive film was measured through a compressive ratio meter (Yasuda corporation), and the result was shown in Table 1.

5. Measurement of Polishing Rate of Wafer

By using CMP polishing apparatus like FIG. 3, a silicon wafer with a diameter of 300 mm, in which a silicon oxide film had been formed by TEOS-plasma CVD process, was fixed to a polishing head, and the surface of a silicon wafer was set to face the bottom of a plate, to which the laminated polishing pad was attached. Subsequently, the pressure of polishing was adjusted to be 27.6 kPa, fumed silica slurry was put into a polishing pad in a rate of 200 ml/min, and the plate was rotated at 115 rpm and the polishing head was rotated at 100 rpm for 1 minute, thereby polishing the wafer surface.

After the polishing, the silicon wafer was separated from the polishing head, cleaned with purified water, and dried for 20 seconds in an inert atmosphere. The dried wafer was measured for the thickness variation before and after polishing overall through a reflectometer (SI-F80R, Kyemce corporation), and the polishing rate was calculated through Equation 3 below. Also, the polishing rate according to Equation 3 below was calculated in the inner area (hereinafter, referred to as the inner area) except for the edge area occupying 10% of the diameter at the most in the center direction from the edge of the wafer, and the result was shown in FIG. 4, FIG. 5, and Table 1.

polishing rate=polishing thickness of wafer per minute (Å/minute). [Equation 3]

In Equation 3, the polishing thickness of a wafer shows the thickness variation of the wafer before and after the polishing.

TABLE 1

| Item | Comparative Example 1 (CE 1) | Comparative Example 2 (CE 2) | Example 1 (Ex 1) | Example 2 (Ex 2) | Comparative Example 3 (CE 3) |
|---|---|---|---|---|---|
| The Shape and Size of Through Holes | — | Circle with Diameter of 3 mm | Regular Triangle with Side Length of 7 mm | Circle with Diameter of 7 mm | Circle with Diameter of 10.6 mm |
| Volume Fraction of Through Holes Compared to the Whole | 0% | 2% | 6% | 10.89% | 25% |
| Polishing Rate of Wafer (Å/Minute) | 2547.79 | 2519.12 | 2658.24 | 2646.47 | Nonattachment |
| Standard Deviation of Polishing Rate | 367.96 | 303.63 | 312.53 | 289.67 | Nonattachment |
| Standard Deviation of Polishing Rate of Inner Area* | 45.16 | 92.41 | 22.05 | 24.28 | Nonattachment |
| Compressive Ratio (%) | 0.64 | 0.95 | 1.27 | 1.59 | 3.50 |
| Release Force (kgf) | 2.0 | 1.8 | 1.5 | 1.4 | — |

*(Inner area: The inner area except for the area occupying 10% of the diameter at the most in the center direction from the edge of a wafer)

Figure 4:
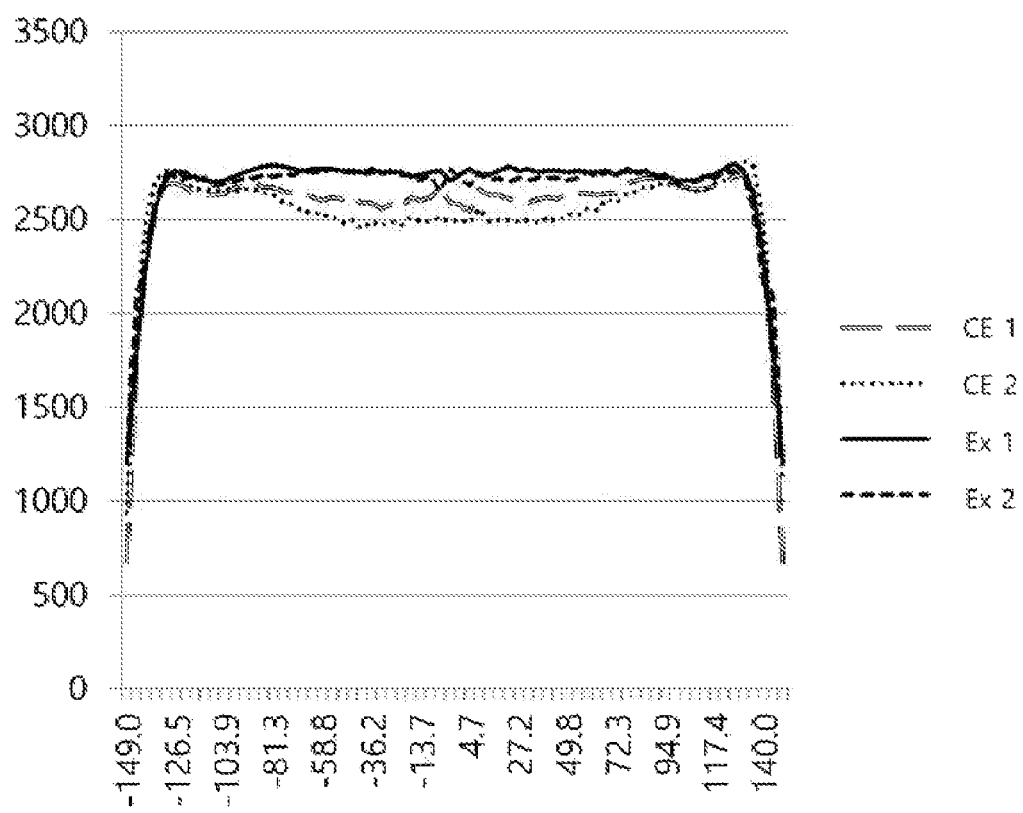
FIG. 4 is a graph showing polishing rates (Å/minute) of Comparative Examples (CE1 and CE2) and Examples (Ex 1 and Ex 2) depending on distance (mm) in the edge direction from the center of the wafers.
Figure 5:
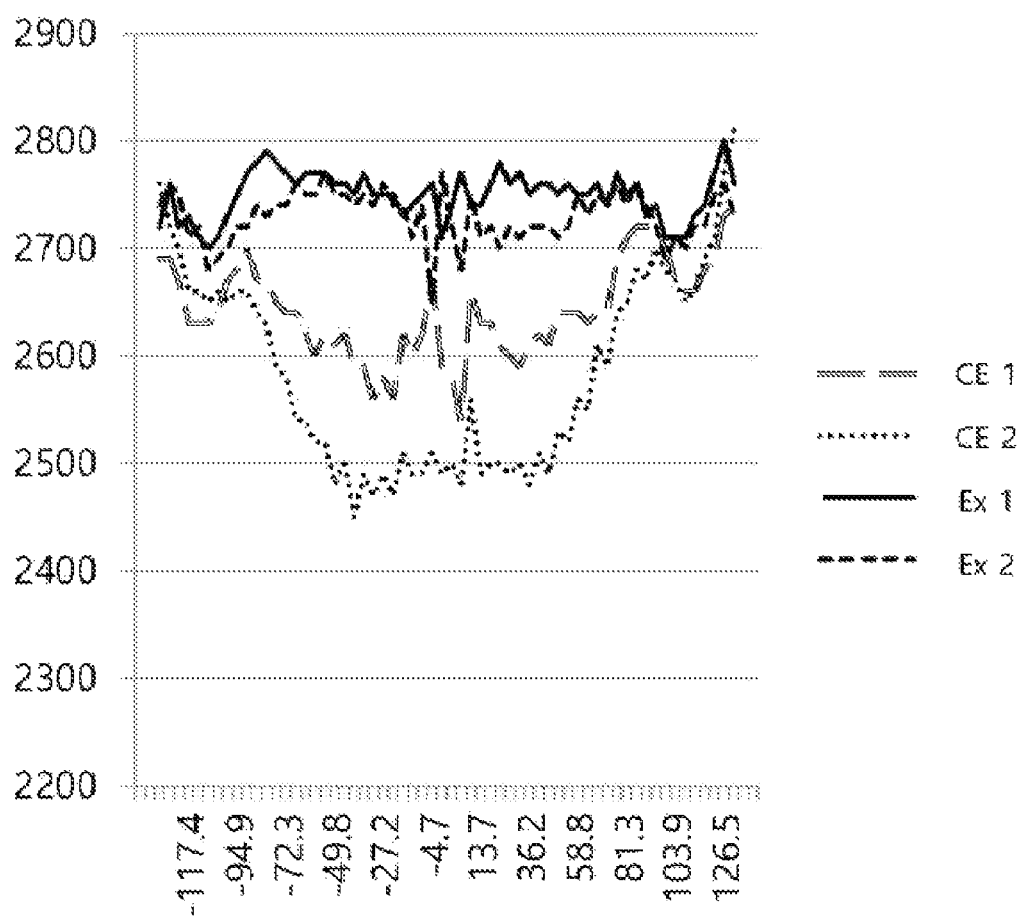
FIG. 5 is a graph for showing polishing rates (Å/minute) of Comparative Examples (CE 1 and CE2) and Examples (Ex 1 and Ex 2) depending on distance (mm) in the edge direction from the center of the wafers, within an inner area except for an edge area occupying equal or less than 10% of a diameter of a wafer in a direction from an edge to a center of the wafer.

With reference to Table 1, FIG. 4, and FIG. 5, the volume fraction of through holes was 2% or less compared to the entire adhesive film, and Comparative Examples whose compressive ratios were 0.95% or less were shown to have a standard deviation of the polishing rate of the inner area, which was 45 or more. The examples with the volume fraction of 3% or more and a compressive ratio of 0.98% or more were shown to have a standard deviation of the polishing rate, which was 30 or less in the inner area, and it could be verified to have more uniform polishing characteristics of a wafer.

In the case of Comparative Example 3, the volume fraction was 25% and the attachment was not easily made.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An adhesive film for a polishing pad comprising:
a plurality of through holes extended from a top surface to a bottom surface of the adhesive film,
wherein a volume fraction of the plurality of through holes is 3% to 20% based on a total volume of the adhesive film,
wherein the adhesive film has a compressive ratio of 0.98% or more and 3.3% or less, the compressive ratio being calculated by (thickness loss after compression/original thickness of the adhesive film)×100%, when the adhesive film is compressed in a thickness direction under a pressure of 6.89 kPa to 48.26 kPa,
wherein a cross-sectional shape of each of the plurality of through holes, when viewed on a plane perpendicular to the thickness direction of the adhesive film, is substantially the same, and
wherein each of the plurality of through holes has an average cross-sectional area from 6 mm$^2$ to 100 mm$^2$, where the average cross-sectional area is obtained by dividing a total cross-sectional area of the plurality of through holes, which is measured on a plane perpendicular to a thickness direction of the adhesive film, by a total number of the plurality of through holes.

2. The adhesive film of claim 1, wherein the plurality of through holes comprise:
a first through hole and a second through hole adjacent to each other,
wherein an interval between the first through hole and the second through hole is 2 mm to 20 mm.

3. The adhesive film of claim 1,
wherein the cross-sectional shape is enclosed by a single closed curve.

4. The adhesive film of claim 1,
wherein the cross-sectional shape is selected from the group consisting of a circle, a square, a triangle, an oval, and a polygon comprising three to eight sides.

5. The adhesive film of claim 1,
wherein a total number of the plurality of through holes is 3 to 300.

6. The adhesive film of claim 1,
wherein the volume fraction of the plurality of through holes is 4% to 18% based on the total volume of the adhesive film.

7. The adhesive film of claim 1,
wherein a release force according to ASTM D3330 of the adhesive film is 1.0 kgf/in to 3.0 kgf/in.

8. The adhesive film of claim 1,
wherein a thickness of the adhesive film is 20 μm to 300 μm.

9. The adhesive film of claim 1,
wherein the compressive ratio is increased by 0.5% to 2.66% compared to an adhesive film for a polishing pad not comprising the plurality of through holes.

10. The adhesive film of claim 1,
wherein an aperture ratio of the plurality of through holes calculated by Equation 2 below is 3% to 20%:

aperture ratio=(cross-sectional area of the plurality of through holes/cross-sectional area of the adhesive film)×100%, [Equation 2]

where the cross-sectional area of the plurality of through holes and the cross-sectional area of the adhesive film are measured on a plane perpendicular to a thickness direction of the adhesive film.

11. A laminated polishing pad comprising:
a polishing pad; and
an adhesive film for the polishing pad attached to one surface of the polishing pad,
wherein the adhesive film comprises a plurality of through holes extended from a top surface to a bottom surface of the adhesive film,
wherein a volume fraction of the plurality of through holes is 3% to 20% based on a total volume of the adhesive film,
wherein the adhesive film has a compressive ratio of 0.98% or more and 3.3% or less, the compressive ratio being calculated by (thickness loss after compression/original thickness of the adhesive film)×100%, when the adhesive film is compressed in a thickness direction under a pressure of 6.89 kPa to 48.26 kPa, and
wherein each of the plurality of through holes has an average cross-sectional area from 6 mm$^2$ to 100 mm$^2$, where the average cross-sectional area is obtained by dividing a total cross-sectional area of the plurality of through holes, which is measured on a plane perpendicular to a thickness direction of the adhesive film, by a total number of the plurality of through holes.

12. The laminated polishing pad of claim 11,
wherein an aperture ratio of the plurality of through holes calculated by Equation 2 below is 3% to 20%:

aperture ratio=(cross-sectional area of the plurality of through holes/cross-sectional area of the adhesive film)×100%, [Equation 2]

where the cross-sectional area of the plurality of through holes and the cross-sectional area of the adhesive film are measured on a plane perpendicular to a thickness direction of the adhesive film.

13. A method of polishing a wafer comprising:
preparing a laminated polishing pad attached to a plate and a polishing head, to which a wafer is fixed; and
rotating any one or both of the plate and the polishing head, while contacting the wafer with the laminated polishing pad with adding slurry,
wherein the laminated polishing pad comprises:
a polishing pad; and
an adhesive film for the polishing pad attached to one surface of the polishing pad,
wherein the polishing pad comprises a plurality of through holes extended from a top surface to a bottom surface of the adhesive film,
wherein a volume fraction of the plurality of through holes is 3% to 20% based on a total volume of the adhesive film,
wherein the adhesive film has a compressive ratio of 0.98% or more and 3.3% or less, the compressive ratio being calculated by (thickness loss after compression/original thickness of the adhesive film)×100%, when the adhesive film is compressed in a thickness direction under a pressure of 6.89 kPa to 48.26 kPa, and
wherein each of the plurality of through holes has an average cross-sectional area from 6 mm$^2$ to 100 mm$^2$, where the average cross-sectional area is obtained by dividing a total cross-sectional area of the plurality of through holes, which is measured on a plane perpendicular to a thickness direction of the adhesive film, by a total number of the plurality of through holes.

14. The method of claim 13,
wherein an aperture ratio of the plurality of through holes calculated by Equation 2 below is 3% to 20%:

aperture ratio=(cross-sectional area of the plurality of through holes/cross-sectional area of the adhesive film)×100%, [Equation 2]

where the cross-sectional area of the plurality of through holes and the cross-sectional area of the adhesive film are measured on a plane perpendicular to a thickness direction of the adhesive film.

* * * * *